United States Patent [19]
Gardner

[11] Patent Number: 5,885,874
[45] Date of Patent: Mar. 23, 1999

[54] METHOD OF MAKING ENHANCEMENT-MODE AND DEPLETION-MODE IGFETS USING SELECTIVE DOPING OF A GATE MATERIAL

[75] Inventor: Mark I. Gardner, Cedar Creek, Tex.

[73] Assignee: Advanced Micro Devices, Inc., Sunnyvale, Calif.

[21] Appl. No.: 837,525

[22] Filed: Apr. 21, 1997

[51] Int. Cl.$^6$ .............................................. H01L 21/8236
[52] U.S. Cl. ..................... 438/289; 438/275; 438/276; 438/519
[58] Field of Search ................................ 438/275, 276, 438/289, 522, 532, 549; 148/DIG. 40; 257/205

[56] References Cited

U.S. PATENT DOCUMENTS

| | | | |
|---|---|---|---|
| 4,085,498 | 4/1978 | Rideout | 29/571 |
| 4,329,186 | 5/1982 | Kotecha et al. | 148/1.5 |
| 4,725,871 | 2/1988 | Yamazaki | 357/23.12 |
| 5,021,356 | 6/1991 | Henderson et al. | 438/294 |
| 5,300,443 | 4/1994 | Shimabukuro et al. | 437/34 |
| 5,512,506 | 4/1996 | Chang et al. | 437/44 |
| 5,688,722 | 11/1997 | Harrington, III | 438/217 |

OTHER PUBLICATIONS

Silicon Processing for the VLSI Era—vol. 3: The Submicron MOSFET, by S. Wolf, published by Lattice Press, Sunset Beach. CA, 1995, pp. 554–555.

*Primary Examiner*—Peter Toby Brown
*Assistant Examiner*—Maria Guerrero
*Attorney, Agent, or Firm*—Skjerven, Morrill, MacPherson, Franklin & Friel, L.L.P.

[57] ABSTRACT

A method of making enhancement-mode and depletion-mode IGFETs is disclosed. The method includes providing a semiconductor substrate with first and second device regions, forming a gate material over the first and second device regions, implanting a dopant into the gate material such that a peak concentration of the dopant has a first depth in the gate material over the first device region and a second depth in the gate material over the second device region, and the first depth is substantially greater than the second depth, etching the gate material to form a first gate over the first device region and a second gate over the second device region after implanting the dopant into the gate material, forming sources and drains in the first and second device regions, and transferring the dopant into a first channel region in the first device region without transferring essentially any of the dopant into a second channel region in the second device region, thereby providing depletion-mode doping in the first channel region while retaining enhancement-mode doping in the second channel region. The dopant can be simultaneously implanted into the gate material over the first and second device regions using a displacement material over the gate material over the second device region. Alternatively, the dopant can be sequentially implanted into the gate material over the first device region with a first implant energy and into the gate material over the second device region with a second implant energy. Preferably, the dopant is transferred from the first gate into the first channel region by diffusion.

33 Claims, 5 Drawing Sheets

METHOD OF MAKING ENHANCEMENT-MODE AND DEPLETION-MODE IGFETS USING SELECTIVE DOPING OF A GATE MATERIAL

BACKGROUND OF THE INVENTION

1. Field of the Invention

The present invention relates to integrated circuit manufacturing, and more particularly to insulated-gate field-effect transistors.

2. Description of Related Art

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in order to modulate the longitudinal conductance of the channel.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide a gate. Thereafter, the gate provides an implant mask during the formation of source and drain regions by ion implantation, and the implanted dopants are driven-in and activated using a high-temperature anneal that would otherwise melt the aluminum.

An important parameter in IGFETs is the threshold voltage ($V_T$), which is the minimum gate voltage required to induce the channel. In general, the positive gate voltage of an N-channel device must be larger than some threshold voltage before a conducting channel is induced, and the negative gate voltage of a P-channel device must be more negative than some threshold voltage to induce the required positive charge (mobile holes) in the channel. There are, however, exceptions to this general rule. For example, depletion-mode devices already have a conductive channel with zero gate voltage, and therefore are normally on. With N-channel depletion-mode devices a negative gate voltage is required to turn the devices off, and with P-channel depletion-mode devices a positive gate voltage is required to turn the devices off.

Depletion-mode devices are often used as nonlinear load circuits to provide a more favorable current-voltage relationship than is possible with linear load circuits using resistors or enhancement-mode devices. Enhancement-mode devices are often used as switches in digital circuits to prevent or allow the flow of electrical currents.

Enhancement-mode and depletion-mode devices are often fabricated on the same semiconductor substrate or chip to provide an integrated circuit such as a microprocessor. An array of devices can be fabricated in an integrated circuit layout, with some adjusted by implantation to obtain the desired enhancement-mode doping and others implanted to become depletion loads. A separate implantation step is typically used to provide some channel regions with depletion-mode doping while others retain enhancement-mode doping.

For example, prior to gate oxide formation, a masking layer can cover the device regions intended for enhancement-mode devices while providing openings over device regions intended for depletion-mode devices, and then the structure can be subjected to ion implantation so that only the exposed device regions are provided with depletion-mode doping. A drawback to this approach, however, is that it may be desirable to utilize the implant step that provides depletion-mode doping for increasing a doping concentration of the gate as well.

Alternatively, after-gate implantations (such as wells, channel-stop doping, $V_T$ control, source/drain, etc.) can be used to provide depletion-mode doping after the gates are patterned. Studies indicate that after-gate implantations do not degrade the gate oxide integrity or the device characteristics. For example, U.S. Pat. No. 4,329,186 to Kotecha et al. discloses a technique for forming enhancement-mode and depletion-mode devices, in which after the gates are formed, a photoresist layer is patterned to cover some gates and expose other gates, and then ions are implanted through the exposed gates directly into the underlying channel regions to provide depletion-mode doping in these channel regions. Since the photoresist layer provides an implant mask, the channel regions underlying the gates covered by the photoresist layer retain enhancement-mode doping. However, it may be difficult to precisely align the openings in the photoresist mask with the gates to be implanted through.

A problem encountered in P-channel devices with polysilicon gates containing a high concentration of boron is that when a thin gate oxide is used, poor $V_T$ control may arise due to unwanted boron penetration into the gate oxide, or further, into the underlying channel region. It is reported that boron will penetrate gate oxides that are less than 125 angstroms thick during a 900° C. 30-minute post-imrlant anneal in nitrogen. It has also been found that the presence of fluorine in the gate oxide worsens the boron penetration problem. Such fluorine can be introduced into the gate oxide if boron difluoride ($BF_2$) is the implant species. Unfortunately, in some instances, the boron penetration may be sufficiently large to provide depletion-mode doping in channel regions intended for enhancement-mode devices.

Accordingly, a need exists for an improved method of making enhancement-mode and depletion-mode IGFETs in the desired device regions.

SUMMARY OF THE INVENTION

An object of the present invention is provide an improved method of making enhancement-mode and depletion-mode IGFETs. This is accomplished by selectively doping a gate material before etching the gate material to form a first gate for a depletion-mode device and a second gate for an enhancement-mode device.

In accordance with one aspect of the invention, a method of making enhancement-mode and depletion-mode IGFETs includes providing a semiconductor substrate with first and second device regions, forming a gate material over the first and second device regions, implanting a dopant into the gate material such that a peak concentration of the dopant has a first depth in the gate material over the first device region and a second depth in the gate material over the second device region, and the first depth is substantially greater than the second depth, etching the gate material to form a first gate over the first device region and a second gate over the second device region after implanting the dopant into the gate material, forming sources and drains in the first and second device regions, and transferring the dopant into a first channel region in the first device region without transferring essentially any of the dopant into a second channel region in the second device region, thereby providing depletion-mode doping in the first channel region while retaining enhancement-mode doping in the second channel region.

The dopant can be simultaneously implanted into the gate material over the first and second device regions using a displacement material over the gate material over the second device region, such that a difference between the first and second depths is due to the displacement material. Alternatively, the dopant can be sequentially implanted into the gate material over the first device region with a first implant energy while a first implant mask covers the gate material over the second device region, and into the gate material over the second device region with a second implant energy while a second implant mask covers the gate material over the first device region, such that a difference between the first and second depths is due the a difference between the first and second implant energies.

The dopant can be transferred into the first channel region by being implanted through the gate material over the first channel region, or by being implanted into the gate material over the first channel region and then diffused from the gate material over the first channel region into the first channel region before etching the gate material to form the first gate, or by being implanted into the gate material over the first channel region and then diffused from the first gate into the first channel region after etching the gate material to form the first gate.

Preferably, the peak concentration of the implanted dopant is in the lower half of the gate material over the first device region and in the upper half of the gate material over the second device region, and the transferred dopant provides essentially all depletion-mode doping for the first channel region. It is also preferred that the dopant is boron or boron species, and the gate material is a polysilicon layer with essentially identical thicknesses over the first and second device regions.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

In the drawings, depicted elements are not necessarily drawn to scale and like or similar elements may be designated by the same reference numeral throughout the several views.

FIGS. 1A–1K show cross-sectional views of successive process steps for making enhancement-mode and depletion-mode IGFETs using selective doping of a gate material in accordance with a first embodiment of the invention.

Figure 1A:
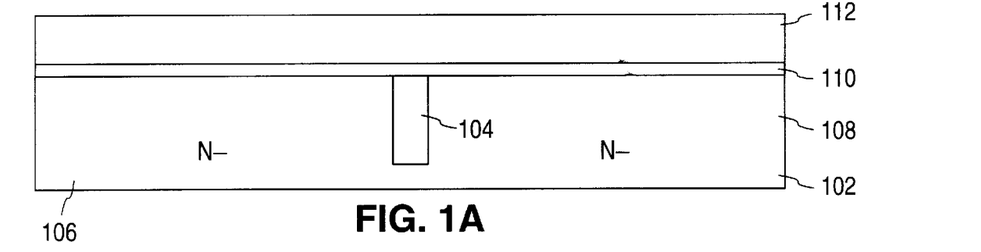
FIGS. 1A–1K show cross-sectional views of successive process steps for making enhancement-mode depletion-mode IGFETs using selective doping of a gate material in accordance with a first embodiment of the invention.

In FIG. 1A, silicon substrate 102 suitable for integrated circuit manufacture is provided. Substrate 102 includes a N-type well (shown) with a planar top surface in a P– type epitaxial surface layer on a P+ base layer (not shown). The N-well has a phosphorus background concentration on the order of $1\times10^{16}$ atoms/cm$^3$, a <100> orientation and a resistivity of 12 ohm-cm. Trench oxide 104, composed of silicon dioxide (SiO$_2$), provides dielectric isolation between devices regions 106 and 108 in substrate 102. A blanket layer of gate oxide 110, composed of silicon dioxide, is formed on the top surface of substrate 102 using tube growth at a temperature of 700° to 1000° C. in an O$_2$ containing ambient. Gate oxide 110 has a thickness in the range of 30 to 100 angstroms. Thereafter, polysilicon layer 112 is deposited by low pressure chemical vapor deposition on the top surface of gate oxide 110. Polysilicon layer 112 is undoped and has a thickness of 2000 angstroms over device regions 106 and 108.

Figure 1B:
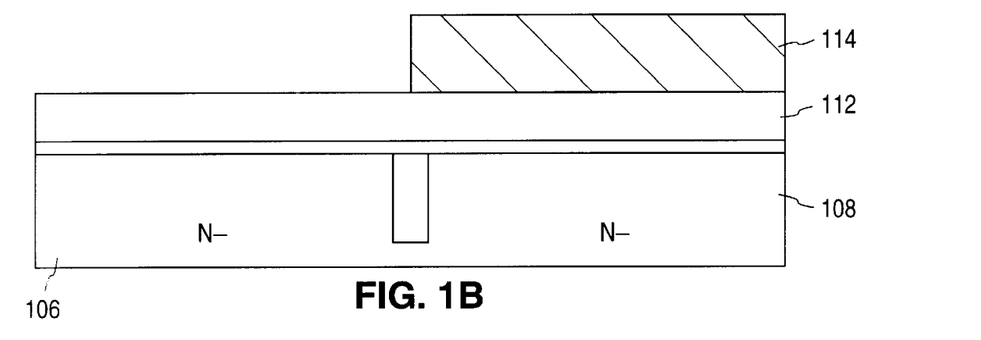

In FIG. 1B, photoresist layer 114 is deposited on polysilicon layer 112. A photolithographic system, such as a step and repeat optical projection system which generates deep ultraviolet light from a mercury-vapor lamp, uses a first reticle to irradiate photoresist layer 114 with a first image pattern. Thereafter, the irradiated portions of photoresist layer 114 are removed, and photoresist layer 114 covers device region 108 but contains an opening above device region 106. Photoresist layer 114 has a thickness in the range of 10,000 to 12,000 angstroms.

Figure 1C:
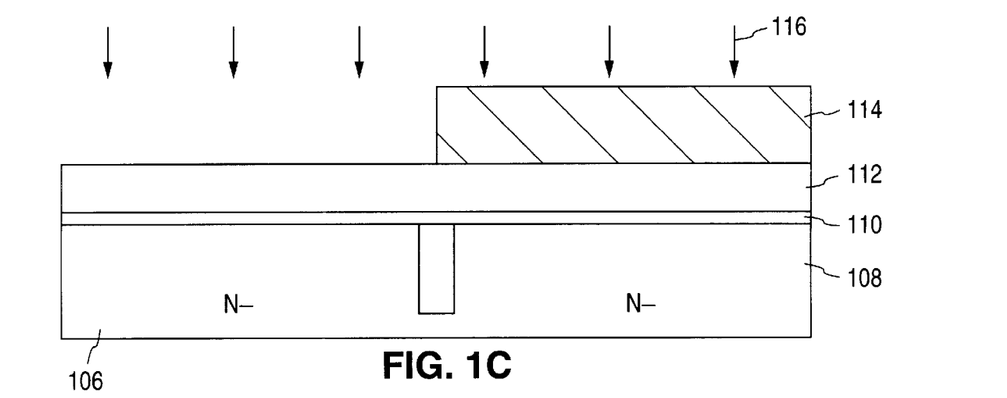

In FIG. 1C, the structure is subjected to ion implantation of boron, indicated by arrows 116, at a dose in the range of $1\times10^{15}$ to $5\times10^{15}$ atoms/cm$^2$ and an energy of 50 to 100 kiloelectron-volts, using photoresist layer 114 as an implant mask. As a result, polysilicon layer 112 over device region 106 becomes heavily doped with boron, the polysilicon layer 112 over device region 108 remains essentially undoped. The peak concentration of the boron indicated by arrows 116 is implanted into the lower half of polysilicon layer 112 over device region 106, and essentially all of the boron that impinges upon polysilicon layer 112 over device region 106 is implanted into polysilicon layer 112 and does not reach gate oxide 110 or device region 106.

Figure 1D:
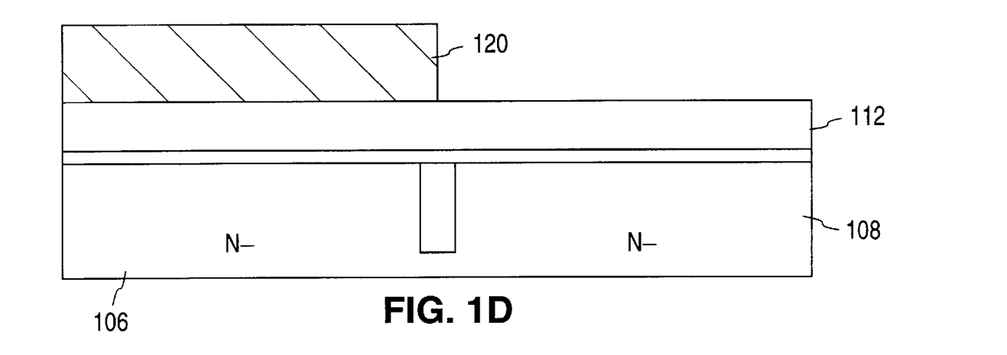

In FIG. 1D, photoresist layer 114 is stripped, and photoresist layer 120 is deposited on polysilicon layer 112. The photolithographic system uses a second reticle to irradiate photoresist layer 120 with a second image pattern. Thereafter, the irradiated portions of photoresist layer 120 are removed, and photoresist layer 120 covers device region 106 but contains an opening above device region 108. Photoresist layer 120 has a thickness in the range of 10,000 to 12,000 angstroms.

Figure 1E:
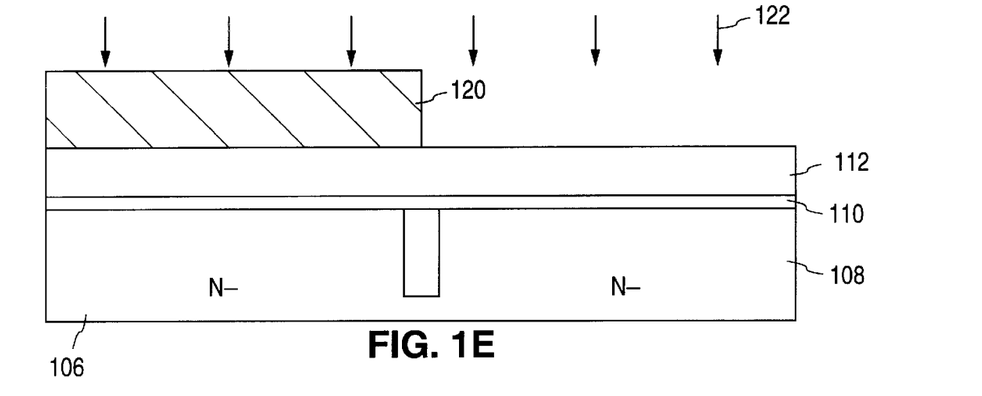

In FIG. 1E, the structure is subjected to ion implantation of boron, indicated by arrows 122, at a dose in the range of $1>10^{15}$ to $5\times10^{15}$ atoms/cm$^2$ and an energy of 10 to 25 kiloelectron-volts, using photoresist layer 120 as an implant mask. As a result, polysilicon layer 112 over device region 108 becomes heavily doped with boron, and the doping of polysilicon layer 112 over device region 106 remains essentially unchanged. The peak concentration of the boron indicated by arrows 122 is implanted into the upper half of polysilicon layer 112 over device region 108, and essentially all of the boron that impinges upon polysilicon layer 112 over device region 108 is implanted into polysilicon layer 112 and does not reach gate oxide 110 or device region 108.

It should be noted that the peak concentration of the boron in polysilicon layer 112 over device region 106 has a substantially greater depth than that of the peak concentration of the boron in polysilicon layer 112 over device region 108.

Figure 1F:
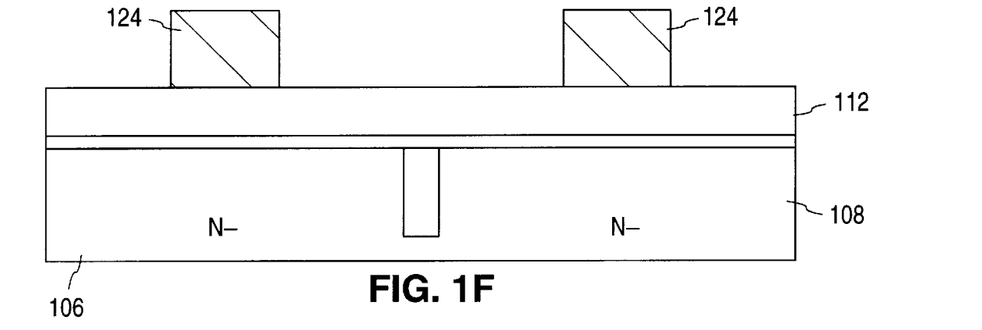

In FIG. 1F, photoresist layer 120 is stripped, and photoresist layer 124 is deposited on polysilicon layer 112. The photolithographic system uses a third reticle to irradiate photoresist layer 124 with a third image pattern. Thereafter, the irradiated portions of photoresist layer 124 are removed, and photoresist layer 124 includes openings above selected portions of device regions 106 and 108.

Figure 1G:
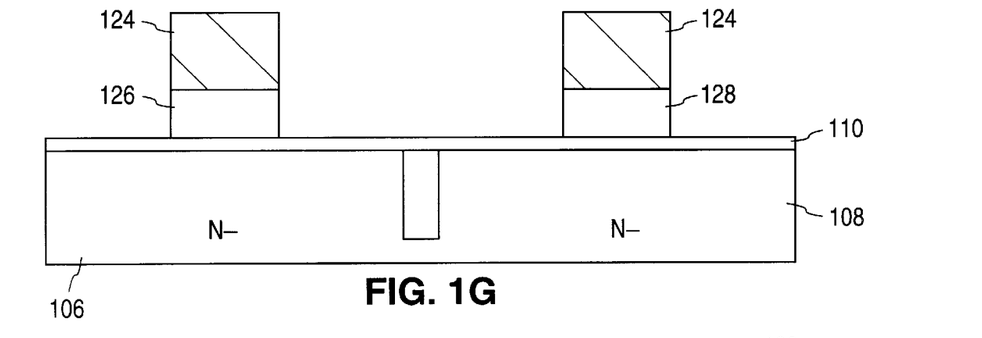

In FIG. 1G, an anisotropic dry etch is applied using photoresist layer 124 as an etch mask.

Photoresist layer 124 protects the underlying regions of polysilicon layer 112, and the etch removes the regions of polysilicon layer 112 beneath the openings in photoresist layer 124. The etch is highly selective of polysilicon with respect to silicon dioxide, so only a negligible amount of gate oxide 110 is removed and substrate 102 is unaffected. The etch forms gate 126 from the unetched portion of polysilicon layer 112 over device region 106, and gate 128 from the unetched portion of polysilicon layer 112 over device region 108. Gates 126 and 128 each have opposing vertical sidewalls separated by a length of 3500 angstroms, and a thickness (or height above the underlying gate oxide 110) of 2000 angstroms.

Figure 1H:
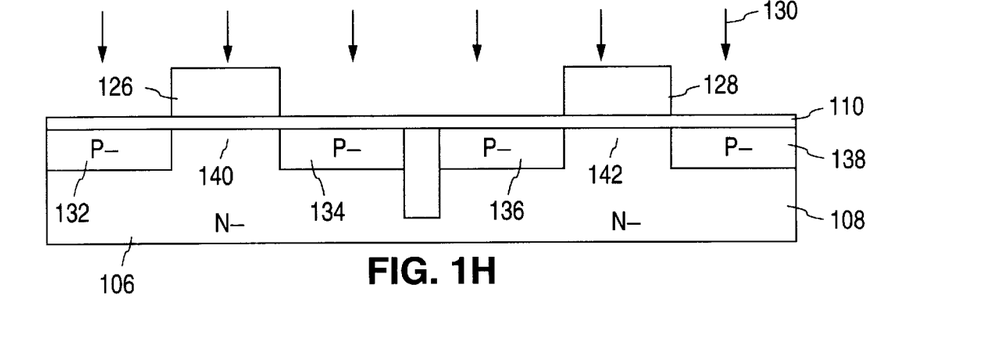

In FIG. 1H, photoresist layer 124 is stripped, and lightly doped source and drain regions are implanted into the device regions by subjecting the structure to ion implantation of boron, indicated by arrows 130, at a dose in the range of $1\times10^{13}$ to $5\times10^{14}$ atoms/cm$^2$ and an energy of 10 to 25 kiloelectron-volts, using gates 126 and 128 as implant masks for device regions 106 and 108, respectively. As a result, lightly doped source/drain regions 132 and 134 are implanted into device region 106 outside gate 126 and are self-aligned to the opposing vertical sidewalls of gate 126, and lightly doped source/drain regions 136 and 138 are implanted into device region 108 outside gate 128 and are self-aligned to the opposing vertical sidewalls of gate 128. The peak concentration of the boron indicated by arrows 130 is implanted into the upper halves of gates 126 and 128, and essentially all of the boron that impinges upon gates 126 and 128 is implanted into gates 126 and 128 without reaching gate oxide 110 or device regions 106 and 108.

Channel region 140 is in device region 106 beneath gate 126 and is adjacent to lightly doped source/drain regions 132 and 134, and channel region 142 is in device region 108 beneath gate 128 and is adjacent to lightly doped source/drain regions 136 and 138. Lightly doped source/drain regions 132, 134, 136 and 138 are doped P− with a boron concentration of about $1\times10^{17}$ to $1\times10^{18}$ atoms/cm$^3$, and channel regions 140 and 142 continue to be doped N− with a phosphorus concentration of about $1\times10^{16}$ atoms/cm$^3$.

Figure 1I:
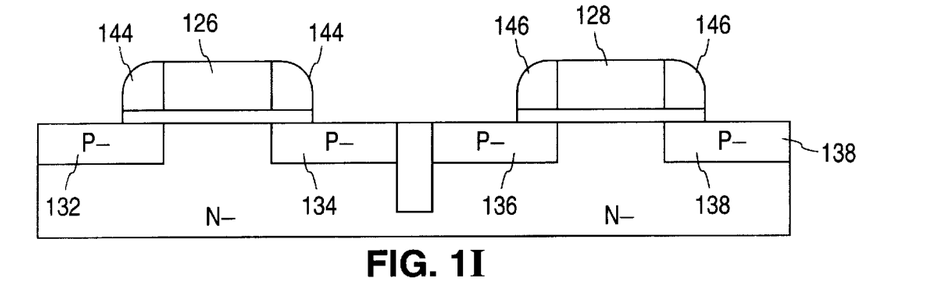

In FIG. 1I an oxide layer with a thickness of 2500 angstroms is conformally deposited over the exposed surfaces by plasma enhanced chemical vapor deposition at a temperature in the range of 300° to 450° C. Thereafter, the structure is subjected to an anisotropic reactive ion etch that forms oxide spacers 144 adjacent to the opposing sidewalls of gate 126 and oxide spacers 146 adjacent to the opposing sidewalls of gate 128. Spacers 144 cover portions of lightly doped source/drain regions 132 and 134, and spacers 146 cover portions of lightly doped source/drain regions 136 and 138.

Figure 1J:
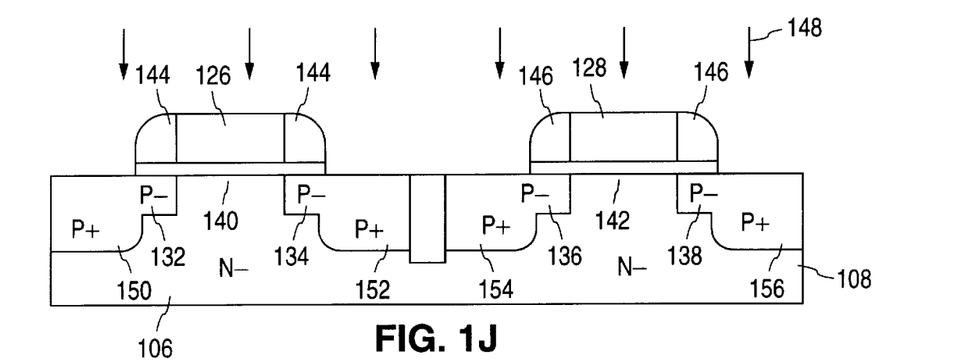

In FIG. 1J, heavily doped source and drain regions are implanted into the device regions by subjecting the structure to ion implantation of boron, indicated by arrows 148, at a dose in the range of $1\times10^{15}$ to $5\times10^{15}$ atoms/cm$^2$ and an energy of 10 to 25 kiloelectron-volts, using gate 126 and spacers 144 as an implant mask for device region 106, and using gate 128 and spacers 146 as an implant mask for device region 108. As a result, heavily doped source/drain regions 150 and 152 are implanted in device region 106 and are self-aligned to the outside edges of spacers 144, and heavily doped source/drain regions 154 and 156 are implanted in device region 108 and are self-aligned to the outside edges of spacers 146. The peak concentration of the boron indicated by arrows 148 is implanted into the upper halves of gates 126 and 128, and essentially all of the boron that impinges upon gates 126 and 128 is implanted into gates 126 and 128 without reaching gate oxide 110 or device regions 106 and 108. Heavily doped source/drain regions 150, 152, 154 and 156 are doped P+ with a boron concentration in the range of about $1\times10^{18}$ to $1\times10^{20}$ atoms/cm$^3$, and the doping concentrations of lightly doped source/drain regions 132, 134, 136 and 138 beneath spacers 144 and 146 as well as channel regions 140 and 142 are essentially unaffected.

Figure 1K:
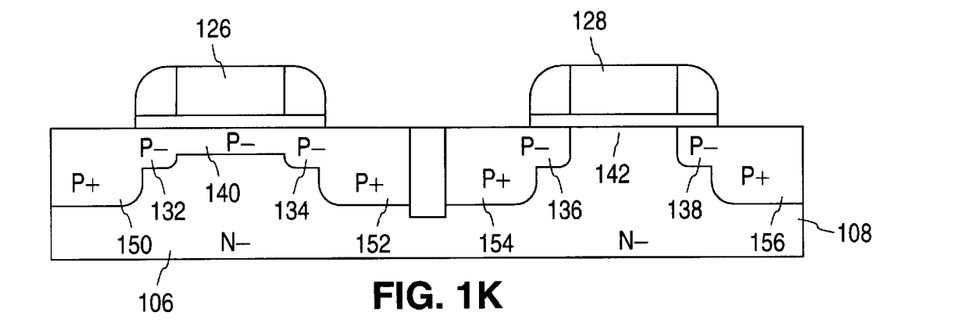

In FIG. 1K, the device is annealed to remove crystalline damage and to drive-in and activate the implanted dopants, and to provide depletion-mode doping in one of the channel regions (but not the other channel region) by applying a rapid thermal anneal on the order of 950° to 1050° C. for 10 to 30 seconds. The implanted boron rapidly diffuses both laterally and vertically. The boron indicated by arrows 122 has been implanted into polysilicon layer 112 over device region 108 with a sufficiently shallow depth that essentially none of it diffuses from gate 128 into channel region 142. Similarly, the boron indicated by arrows 130 and 148 has been implanted into gates 126 and 128 with a sufficiently shallow depth that essentially none of it diffuses from gates 126 and 128 into channel regions 140 and 142, respectively. However, the boron indicated by arrows 116 has been implanted into polysilicon layer 112 over device region 106 with a sufficiently large depth that a substantial amount of it does diffuse from gate 126 into channel region 140. As a result, depletion-mode doping is provided for channel region 140, and enhancement-mode doping is retained for channel region 142.

Channel region 140 is doped P− with a boron concentration in the range of about $5\times10^{16}$ to $5\times10^7$ atoms/cm$^3$, and channel region 142 continues to be doped N− with a phosphorus concentration of about $1\times10^{16}$ atoms/cm$^3$. Preferably, the boron concentration in channel region 140 is substantially less than that of lightly doped source/drain regions 132 and 134. Furthermore, source regions 132 and 150 form a source and drain regions 134 and 152 form a drain for a depletion-mode P-channel IGFET in device region 106, and similarly, source regions 136 and 154 form a source and drain regions 138 and 156 form a drain for an enhancement-mode P-channel IGFET in device region 108. In addition, the lightly doped regions extend slightly beneath the gates, and the heavily doped regions extend slightly beneath the spacers.

Of importance, essentially all depletion-mode doping for channel region 140 is provided by boron, indicated by arrows 116, from a single implant step into a polysilicon layer that is subsequently etched to form a gate, by way of diffusion of the implanted boron from the gate. In this manner, the relatively high implant energy of the boron indicated by arrows 116 provides for depletion-mode doping and the relatively low implant energy of the boron indicated by arrows 122 provides for enhancement-mode doping.

FIGS. 2A–2I show cross-sectional views of successive process steps for forming enhancement-mode and depletion-mode IGFETs using selective doping of a gate material in accordance with a second embodiment of the invention. In the first embodiment, the dopant is sequentially implanted into the gate material over the first device region with a first implant energy while a first implant mask covers the gate material over the second device region, and then implanted into the gate material over the second device region with a second implant energy while a second implant mask covers the gate material over the first device region, such that a difference between the first and second depths is due the a difference between the first and second implant energies. In the second embodiment, the dopant is simultaneously implanted into the gate material over the first and second device regions using a displacement material over the gate material over the second device region, such that a difference between the first and second depths is due to the displacement material. Unless otherwise noted, the elements for the second embodiment (e.g., substrate 202, gate oxide 210, etc.) are similar to elements of the first embodiment (e.g., substrate 102, gate oxide 110, etc.), and the description of related elements and process steps need not be repeated.

Figure 2A:
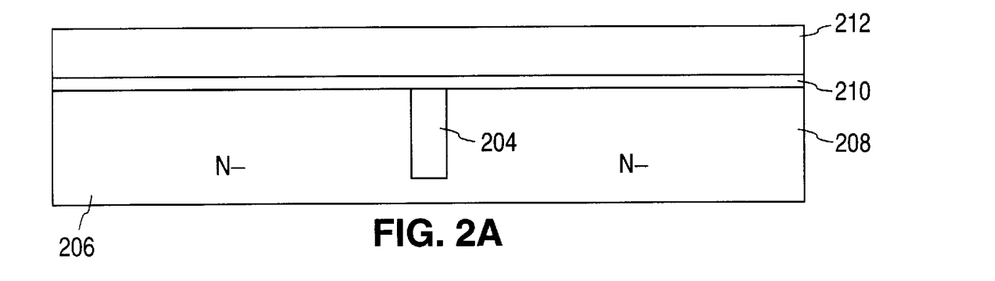
FIGS. 2A–2I show cross-sectional views of successive process steps for making enhancement-mode and depletion-mode IGFETs using selective doping of a gate material in accordance with a second embodiment of the invention.

In FIG. 2A, silicon substrate 202 suitable for integrated circuit manufacture is provided. Substrate 202 includes a N– type well (shown) with a phosphorus background concentration on the order of $1\times10^{16}$ atoms/cm$^3$, a <100> orientation and a resistivity of 12 ohm-cm. Trench oxide 204 provides dielectric isolation between devices regions 206 and 208 in substrate 202. A blanket layer of gate oxide 210 with a thickness of 30 to 100 angstroms is formed on substrate 202. Thereafter, undoped polysilicon layer 212 with a thickness of 2000 angstroms is deposited on gate oxide 210.

Figure 2B:
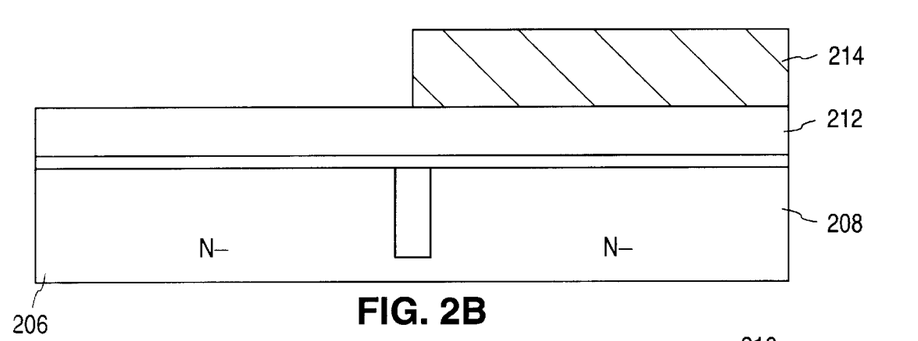

In FIG. 2B, photoresist layer 214 is deposited on polysilicon layer 212. A photolithographic system uses a first reticle to irradiate photoresist layer 214 with a first image pattern. Thereafter, the irradiated portions of photoresist layer 214 are removed, and photoresist layer 214 covers device region 208 but contains an opening above device region 206. Photoresist layer 214 has a thickness in the range of 2000 to 5000 angstroms (which is substantially less than the thickness of photoresist layer 114 in the first embodiment).

Figure 2C:
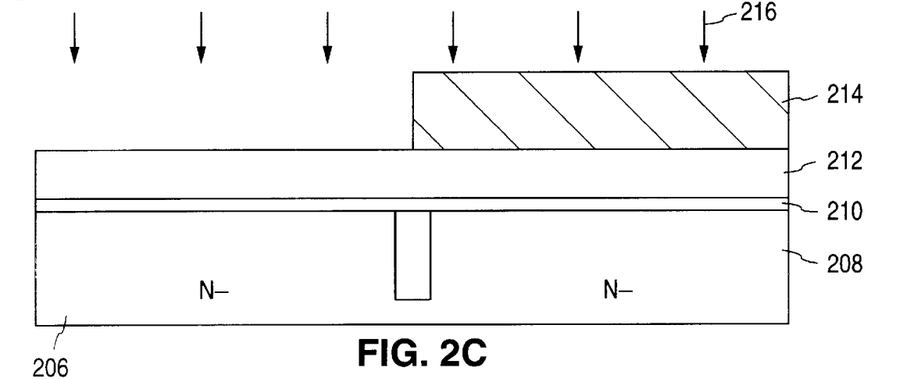

In FIG. 2C, the structure is subjected to ion implantation of boron, indicated by arrows 216, at a dose in the range of $1\times10^{15}$ to $5\times10^{15}$ atoms/cm$^2$ and an energy of 50 to 100 kiloelectron-volts, using photoresist layer 214 as a displacement material (instead of an implant mask). A substantial amount of the boron that impinges upon photoresist layer 214 passes through photoresist layer 214. As a result, polysilicon layer 212 over device regions 206 and 208 becomes heavily doped with boron. The peak concentration of the boron indicated by arrows 216 is implanted into the lower half of polysilicon layer 212 over device region 206, and into the upper half of polysilicon layer 212 over device region 208. Thus, photoresist layer 214 serves to shift the peak concentration of the boron in polysilicon layer 212 over device region 208 from the lower half to the upper half. Furthermore, essentially all of the boron that impinges upon polysilicon layer 212 over device regions 206 and 208 is implanted into polysilicon layer 212 and does not reach gate oxide 210 or device regions 206 and 208.

Figure 2D:
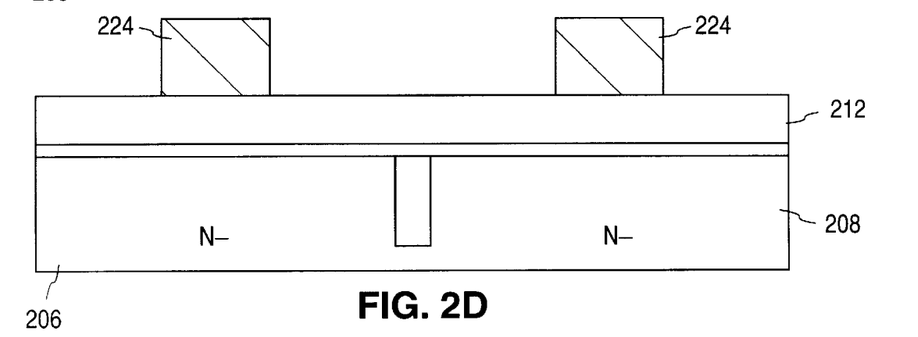

In FIG. 2D, photoresist layer 214 is stripped, and photoresist layer 224 is deposited on polysilicon layer 212. The photolithographic system uses a second reticle (similar to the third reticle in the first embodiment) to irradiate photoresist layer 224 with a second image pattern (similar to the third image pattern in the first embodiment). Thereafter, the irradiated portions of photoresist layer 224 are removed, and photoresist layer 224 includes openings above selected portions of device regions 206 and 208.

Figure 2E:
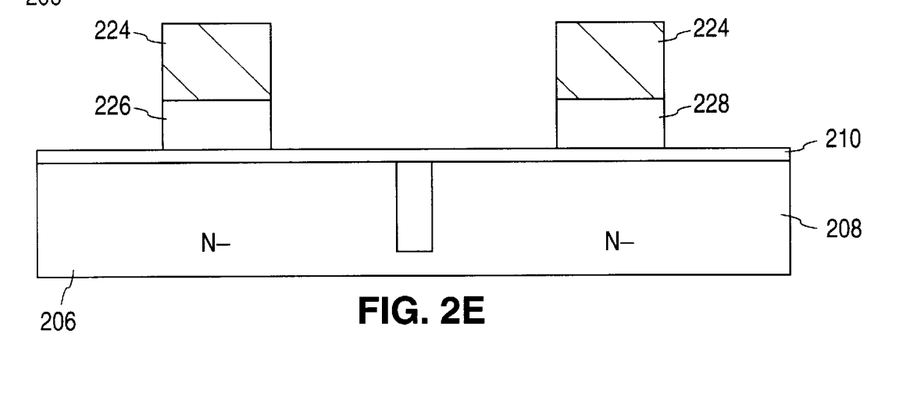

In FIG. 1E, an anisotropic dry etch is applied using photoresist layer 224 as an etch mask. Photoresist layer 224 protects the underlying regions of polysilicon layer 212, and the etch removes the regions of polysilicon layer 212 beneath the openings in photoresist layer 224. The etch is highly selective of polysilicon with respect to silicon dioxide, so only a negligible amount of gate oxide 210 is removed and substrate 202 is unaffected. The etch forms gate 226 from the unetched portion of polysilicon layer 212 over device region 206, and gate 228 from the unetched portion of polysilicon layer 212 over device region 208. Gates 226 and 228 each have opposing vertical sidewalls separated by a length of 3500 angstroms, and a thickness (or height above the underlying gate oxide 210) of 2000 angstroms.

Figure 2F:
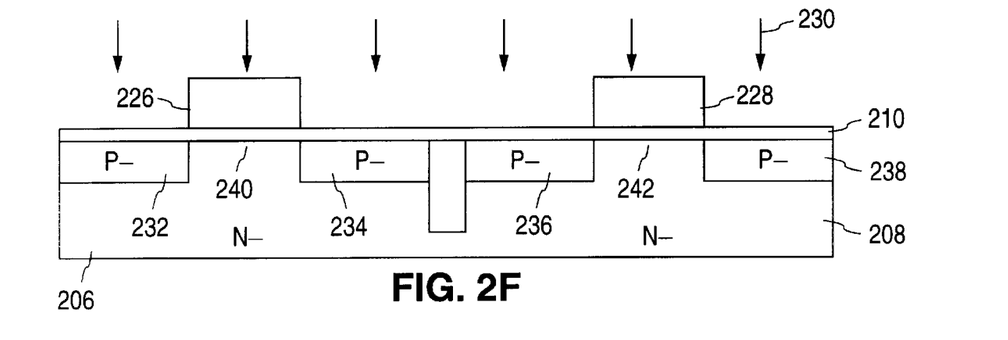

In FIG. 2F, photoresist layer 224 is stripped, and lightly doped source and drain regions are implanted into the device regions by subjecting the structure to ion implantation of boron, indicated by arrows 230, at a dose in the range of $1\times10^{13}$ to $5\times10^{14}$ atoms/cm$^2$ and an energy of 10 to 25 kiloelectron-volts, using gates 226 and 228 as implant masks for device regions 206 and 208, respectively. As a result, lightly doped source/drain regions 232 and 234 are implanted into device region 206 outside gate 226 and are self-aligned to the opposing vertical sidewalls of gate 226, and lightly doped source/drain regions 236 and 238 are implanted into device region 208 outside gate 228 and are self-aligned to the opposing vertical sidewalls of gate 228. The peak concentration of the boron indicated by arrows 230 is implanted into the upper halves of gates 226 and 228, and essentially all of the boron that impinges upon gates 226 and 228 is implanted into gates 226 and 228 without reaching gate oxide 210 or device regions 206 and 208.

Channel region 240 is in device region 206 beneath gate 226 and is adjacent to lightly doped source/drain regions 232 and 234, and channel region 242 is in device region 208 beneath gate 228 and is adjacent to lightly doped source/drain regions 236 and 238. Lightly doped source/drain regions 232, 234, 236 and 238 are doped P– with a boron concentration in the range of about $1\times10^{17}$ to $1\times10^{18}$ atoms/cm$^3$, and channel regions 240 and 242 continue to be doped N– with a phosphorus concentration of about $1\times10^{16}$ atoms/cm$^3$.

Figure 2G:
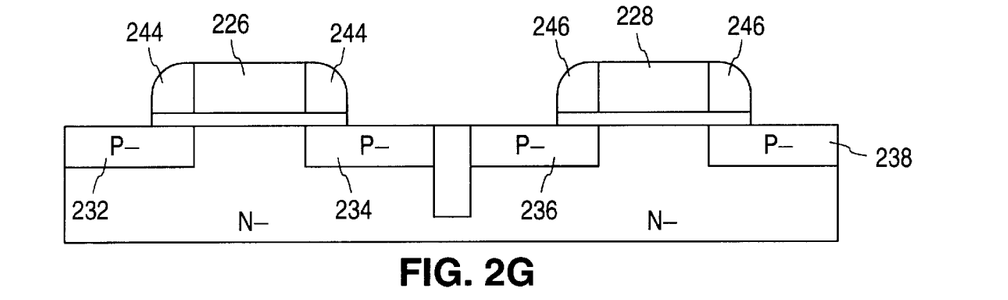

In FIG. 2G, an oxide layer with a thickness of 2500 angstroms is conformally deposited over the exposed surfaces by plasma enhanced chemical vapor deposition at a temperature in the range of 300° to 450° C. Thereafter, the structure is subjected to an anisotropic reactive ion etch that forms oxide spacers 244 adjacent to the opposing sidewalls of gate 226 and oxide spacers 246 adjacent to the opposing sidewalls of gate 228. Spacers 244 cover portions of lightly doped source/drain regions 232 and 234, and spacers 246 cover portions of lightly doped source/drain regions 236 and 238.

Figure 2H:
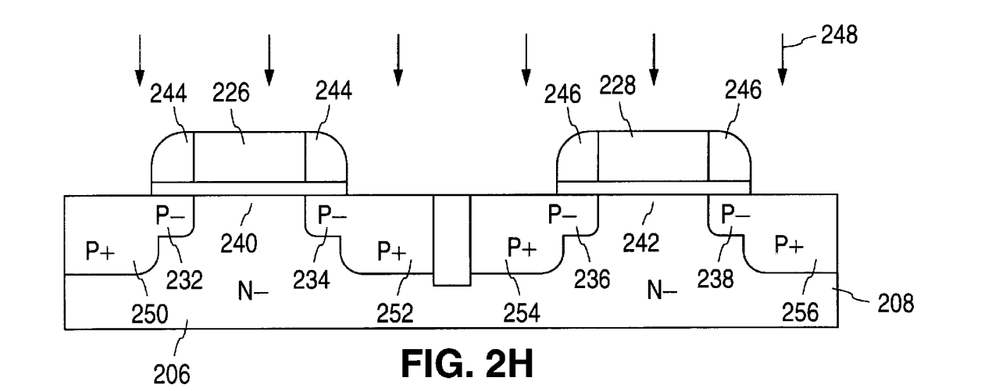

In FIG. 2H, heavily doped source and drain regions are implanted into the device regions by subjecting the structure to ion implantation of boron, indicated by arrows 248, at a dose in the range of $1\times10^5$ to $5\times10^{15}$ atoms/cm$^2$ and an energy of 10 to 25 kiloelectron-volts, using gate 226 and spacers 244 as an implant mask for device region 206, and using gate 228 and spacers 246 as an implant mask for device region 208. As a result, heavily doped source/drain regions 250 and 252 are implanted in device region 206 and are self-aligned to the outside edges of spacers 244, and heavily doped source/drain regions 254 and 256 are implanted in device region 208 and are self-aligned to the outside edges of spacers 246. The peak concentration of the boron indicated by arrows 248 is implanted into the upper halves of gates 226 and 228, and essentially all of the boron that impinges upon gates 226 and 228 is implanted into gates 226 and 228 without reaching gate oxide 210 or device regions 206 and 208. Heavily doped source/drain regions 250, 252, 254 and 256 are doped P+ with a boron concentration in the range of about $1\times10^{18}$ to $1\times10^{20}$ atoms/cm$^3$, and the doping concentrations of lightly doped source/drain regions 232, 234, 236 and 238 beneath spacers 244 and 246 as well as channel regions 240 and 242 are essentially unaffected.

Figure 2I:
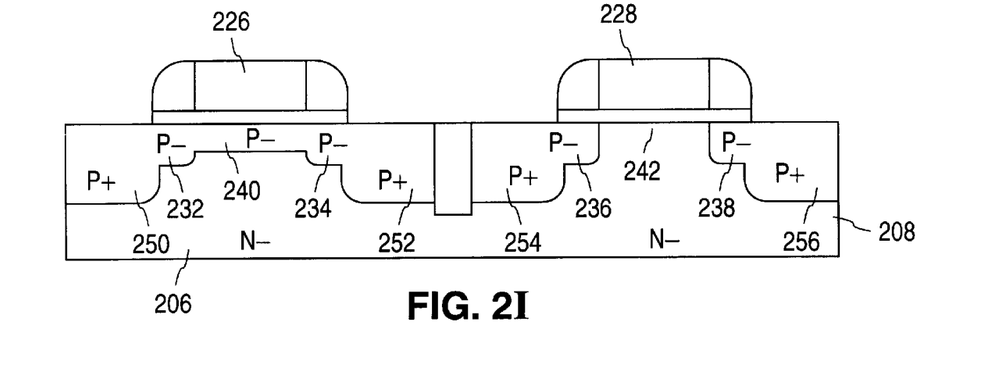

In FIG. 2I the device is annealed to remove crystalline damage and to drive-in and activate the implanted dopants, and to provide depletion-mode doping in one of the channel regions (but not the other channel region) by applying a rapid thermal anneal on the order of 950° to 1050° C. for 10 to 30 seconds. The implanted boron rapidly diffuses both laterally and vertically. The boron indicated by arrows 216 has been implanted into polysilicon layer 212 over device region 208 with a sufficiently shallow depth that essentially none of it diffuses from gate 228 into channel region 242. Similarly, the boron indicated by arrows 230 and 248 has been implanted into gates 226 and 228 with a sufficiently shallow depth that essentially none of it diffuses from gates 226 and 228 into channel regions 240 and 242, respectively. However, the boron indicated by arrows 216 has been implanted into polysilicon layer 212 over device region 206 with a sufficiently large depth that a substantial amount of it diffuses from gate 226 into channel region 240. As a result, depletion-mode doping is provided for channel region 240, and enhancement-mode doping is retained for channel region 242.

Channel region 240 is doped P− with a boron concentration in the range of about $5\times10^{16}$ to $5\times10^{17}$ atoms/cm$^3$, and channel region 242 continues to be doped N− with a phosphorus concentration of about $1\times10^{16}$ atoms/cm$^3$. Preferably, the boron concentration in channel region 240 is substantially less than that of lightly doped source/drain regions 232 and 234. Furthermore, source regions 232 and 250 form a source and drain regions 234 and 252 form a drain for a depletion-mode P-channel IGFET in device region 206, and similarly, source regions 236 and 254 form a source and drain regions 238 and 256 form a drain for an enhancement-mode P-channel IGFET in device region 208. In addition, the lightly doped regions extend slightly beneath the gates, and the heavily doped regions extend slightly beneath the spacers.

Of importance, essentially all depletion-mode doping for channel region 240 is provided by boron, indicated by arrows 216, from a single implant step into a polysilicon layer that is subsequently etched to form a gate, by way of diffusion of the implanted boron from the gate. In this manner, the use of photoresist layer 214 as a displacement material provides for depletion-mode doping in the device region beneath the opening in photoresist layer 214 and enhancement-mode doping in the device region beneath photoresist layer 214.

Further processing steps in the fabrication of IGFETs typically include forming salicide contacts on the gates, sources and drains, forming a thick oxide layer over the device regions, forming contact windows in the oxide layer to expose the salicide contacts, forming interconnect metallization in the contact windows, and forming a passivation layer over the metallization. In addition, earlier or subsequent high-temperature process steps can be used to supplement or replace the anneal step to provide the desired anneal, activation, and drive-in functions. These further processing steps are conventional and need not be repeated herein. Likewise the principal processing steps disclosed herein may be combined with other steps apparent to those skilled in the art.

The present invention includes numerous variations to the embodiments described above. For instance, the gate material can be various conductors, and the gate insulator and spacers can be various dielectrics such as silicon dioxide, silicon nitride and silicon oxynitride. The displacement material can also be silicon dioxide, silicon nitride, silicon oxynitride, doped glass, a metal such as aluminum, or combinations thereof. The device regions can be isolated using various techniques such as LOCOS oxidation, or alternatively need not be isolated from one another. The depletion-mode doping can be provided by implantation through the gate material, or by diffusion from the gate material, or by a combination of implantation through the gate material and subsequent diffusion from the overlying gate. Suitable N-type dopants include arsenic and phosphorus (although it may be difficult to diffuse any appreciable amount of arsenic or phosphorus through the gate insulator); suitable P-type dopants include boron $B_{10}$, boron $B_{11}$, and $BF_X$ species such as $BF_2$.

Furthermore, the present invention can be used to provide enhancement-mode IGFETs with different threshold voltages as well as depletion-mode IGFETs with different threshold voltages. In both instances, the difference in threshold voltages is due to selective doping of the gate material.

The invention is particularly well-suited for fabricating N-channel MOSFETs, P-channel MOSFETs and other types of IGFETs, particularly for high-performance microprocessors where high circuit density is essential. Although a single pair of enhancement-mode and depletion-mode devices has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of making enhancement-mode and depletion-mode IGFETs, comprising the steps of:

provided a semiconductor substrate with first and second device regions;

forming a gate material over the first and second device regions;

implanting a dopant into the gate material such that a peak concentration of the dopant has a first depth in the gate material over the first device region and a second depth in the gate material over the second device region, and the first depth is substantially greater than the second depth;

etching the gate material to form a first gate over the first device region and a second gate over the second device region after implanting the dopant into the gate material;

forming sources and drains in the first and second device regions; and transferring the dopant into a first channel region in the first device region without transferring essentially any of the dopant into a second channel region in the second device region, thereby providing depletion-mode doping in the first channel region while retaining enhancement-mode doping in the second channel region.

2. The method of claim 1, wherein implanting the dopant into the gate material includes implanting the dopant through the gate material into the first channel region, thereby transferring the dopant into the first channel region.

3. The method of claim 1, wherein implanting the dopant into the gate material excludes implanting essentially any of the dopant into the first channel region, and transferring the dopant into the first channel region includes applying heat to diffuse the dopant from the gate material into the first channel region before forming the first gate.

4. The method of claim 1, wherein implanting the dopant into the gate material excludes implanting essentially any of the dopant into the first channel region, and transferring the dopant into the first channel region includes applying heat to diffuse the dopant from the first gate into the first channel region.

5. The method of claim 1, including disposing a displacement material over the gate material over the second device region, and implanting the dopant into the gate material over the first and second device regions simultaneously, wherein a difference between the first and second depths is due to the displacement material.

6. The method of claim 1, including implanting the dopant into the gate material over the first device region with a first implant energy while a first implant mask covers the second device region, and implanting the dopant into the gate material over the second device region with a second implant energy while a second implant mask covers the first device region, wherein the first implant energy is substantially greater than the second implant energy, and a difference between the first and second depths is due to a difference between the first and second implant energies.

7. The method of claim 1, wherein the dopant provides essentially all depletion-mode doping for the first channel region.

8. The method of claim 1, wherein the gate material has essentially identical thicknesses over the first and second device regions.

9. A method of making enhancement-mode and depletion-mode IGFETs, comprising the steps of:

providing a semiconductor substrate with first and second device regions;

forming a gate insulator on the first and second device regions;

forming a gate material on the gate insulator and over the first and second device regions;

implanting a dopant into the gate material without implanting essentially any of the dopant into the substrate such that a peak concentration of the dopant has a first depth in the gate material over the first device region and a second depth in the gate material over the second device region, and the first depth is substantially greater than the second depth;

etching the gate material to form a first gate over the first device region and a second gate over the second device region after implanting the dopant into the gate material;

forming sources and drains in the first and second device regions; and applying heat to diffuse the dopant from the first gate into a first channel region in the first device region beneath the first gate without diffusing essentially any of the dopant from the second gate into a second channel region in the second device region beneath the second gate, thereby providing depletion-mode doping in the first channel region while retaining enhancement-mode doping in the second channel region due to a difference between the first and second depths.

10. The method of claim 9, wherein the dopant provides essentially all depletion-mode doping for the first channel region.

11. The method of claim 9, wherein the gate material has essentially identical thicknesses over the first and second device regions.

12. The method of claim 9, including forming a masking layer over the gate material after implanting the dopant into the gate material, and etching the gate material through openings in the masking layer to form the first and second gates.

13. The method of claim 9, wherein the source and drain in the first device region are substantially aligned with opposing sidewalls of the first gate and are adjacent to opposing ends of the first channel region, and the source and drain in the second device region are substantially aligned with opposing sidewalls of the second gate and are adjacent to opposing ends of the second channel region.

14. The method of claim 9, wherein the gate material is polysilicon.

15. The method of claim 9, wherein the dopant is selected from the group consisting of boron and boron species.

16. The method of claim 9, including implanting the dopant into the gate material over the first device region and implanting the dopant into the gate material over the second device region simultaneously.

17. The method of claim 9, including implanting the dopant into the gate material over the first device region and implanting the dopant into the gate material over the second device region in sequence.

18. The method of claim 9, wherein forming the sources and drains in the first and second device regions includes:

implanting lightly doped source and drain regions in the first and second device regions using the first and second gates as implant masks;

forming first spacers adjacent to opposing sidewalls of the first gate and second spacers adjacent to opposing sidewalls of the second gate; and implanting heavily doped source and drain regions in the first and second device regions using the first and second gates and spacers as implant masks.

19. The method of claim 16, including disposing a displacement material over the gate material over the second device region while implanting the dopant, wherein a difference between the first and second depths is due to the displacement material.

20. The method of claim 17, including implanting the dopant into the gate material over the first device region with a first implant energy while a first implant mask covers the second device region, and implanting the dopant into the gate material over the second device region with a second implant energy while a second implant mask covers the first device region, wherein the first implant energy is substantially greater than the second implant energy, and a difference between the first and second depths is due to a difference between the first and second implant energies.

21. The method of claim 18, wherein applying heat to diffuse the dopant also activates and drives-in the lightly doped and heavily doped source and drain regions.

22. The method of claim 18, wherein applying heat to diffuse the dopant also activates and drives-in the lightly doped source and drain regions before implanting the heavily doped source and drain regions.

23. A method of making P-channel enhancement-mode and depletion-mode IGFETs, comprising the steps of:

providing a semiconductor substrate with first and second device regions of N-type conductivity;

forming a gate oxide on the first and second device regions;

forming a polysilicon layer on the gate oxide and over the first and second device regions, wherein the polysilicon layer has essentially identical thicknesses over the first and second device regions;

implanting a dopant, selected from the group consisting of boron and boron species, into the polysilicon layer without implanting essentially any of the dopant into the substrate such that a peak concentration of the dopant has a first depth in the polysilicon layer over the first device region and a second depth in the polysilicon layer over the second device region, and the first depth is substantially greater than the second depth;

forming a masking layer over the polysilicon layer after implanting the dopant into the polysilicon layer;

etching the polysilicon layer through openings in the masking layer to form a first gate from an unetched portion of the polysilicon layer over the first device region and a second gate from an unetched portion of the polysilicon layer over the second device region;

applying heat to diffuse the dopant from the first gate into a first channel region in the first device region beneath the first gate without diffusing essentially any of the dopant from the second gate into a second channel region in the second device region beneath the second gate, thereby providing depletion-mode doping in the first channel region while retaining enhancement-mode doping in the second channel region due to a difference between the first and second depths; and forming a first source and a first drain in the first device region which are substantially aligned with opposing sidewalls of the first gate and are adjacent to the first channel region, and forming a second source and a second drain in the second device region which are substantially aligned with opposing sidewalls of the second gate and are adjacent to the second channel region.

24. The method of claim 23, wherein the peak concentration of the dopant is in a lower half of the polysilicon layer over the first device region and in an upper half of the polysilicon layer over the second device region before applying the heat.

25. The method of claim 23, including disposing a displacement material over the polysilicon layer over the second device region, and then implanting the dopant into the polysilicon layer over the first and second device regions simultaneously, wherein a difference between the first and second depths is due to the displacement material.

26. The method of claim 23, including implanting the dopant into the polysilicon layer over the first device region with a first implant energy while a first implant mask covers the second device region, and implanting the dopant into the polysilicon layer over the second device region with a second implant energy while a second implant mask covers the first device region, wherein the first implant energy is substantially greater than the second implant energy, and a difference between the first and second depths is due to a difference between the first and second implant energies.

27. The method of claim 25, wherein the displacement material is photoresist.

28. The method of claim 26, wherein the first implant energy is at least twice the second implant energy.

29. A method of making IGFETs with different threshold voltages, comprising the steps of:

providing a semiconductor substrate with first and second device regions;

forming a gate material over the first and second device regions;

implanting a dopant into the gate material such that a peak concentration of the dopant has a first depth in the gate material over the first device region and a second depth in the gate material over the second device region, and the first depth is substantially greater than the second depth;

etching the gate material to form a first gate over the first device region and a second gate over the second device region after implanting the dopant into the gate material;

forming sources and drains in the first and second device regions; and transferring a first amount of the dopant into a first channel region in the first device region and transferring a second amount of the dopant into a second channel region in the second device region, wherein the first amount is greater than the second amount, thereby providing a lower threshold voltage for the first channel region than the second channel region due to a difference between the first and second depths.

30. The method of claim 29, wherein implanting the dopant includes transferring the dopant.

31. The method of claim 29, wherein transferring the dopant includes applying heat after implanting the dopant.

32. The method of claim 29, including disposing a displacement material over the gate material over the second device region, and implanting the dopant into the gate material over the first and second device regions simultaneously, wherein a difference between the first and second depths is due to the displacement material.

33. The method of claim 29, including implanting the dopant into the gate material over the first device region with a first implant energy while a first implant mask covers the second device region, and implanting the dopant into the gate material over the second device region with a second implant energy while a second implant mask covers the first device region, wherein the first implant energy is substantially greater than the second implant energy, and a difference between the first and second depths is due to a difference between the first and second implant energies.

* * * * *